(12) United States Patent
Cheng

(10) Patent No.: US 11,234,332 B2
(45) Date of Patent: Jan. 25, 2022

(54) CIRCUIT BOARD STRUCTURE AND FABRICATING METHOD THEREOF, DISPLAY PANEL AND FABRICATING METHOD THEREOF

(71) Applicants: Ordos Yuansheng Optoelectronics Co., Ltd., Ordos (CN); BOE TECHNOLOGY GROUP CO., LTD., Beijing (CN)

(72) Inventor: Chunghao Cheng, Beijing (CN)

(73) Assignees: Ordos Yuansheng Optoelectronics Co., Ltd., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 143 days.

(21) Appl. No.: 16/556,390

(22) Filed: Aug. 30, 2019

(65) Prior Publication Data
US 2020/0281080 A1   Sep. 3, 2020

(30) Foreign Application Priority Data
Mar. 1, 2019   (CN) .......................... 201910156920.5

(51) Int. Cl.
*H05K 1/02* (2006.01)
*H05K 1/18* (2006.01)

(52) U.S. Cl.
CPC ............. *H05K 1/18* (2013.01); *H05K 1/0269* (2013.01); *H05K 2201/10128* (2013.01); *H05K 2203/166* (2013.01)

(58) Field of Classification Search
CPC ........ H05K 1/0266–0269; H05K 2201/10128; H05K 1/0165; H05K 1/166
See application file for complete search history.

(56) References Cited

U.S. PATENT DOCUMENTS

| 2006/0033906 | A1* | 2/2006 | Ozaki | G03B 27/32 355/77 |
| 2009/0196009 | A1* | 8/2009 | Tsukada | H05K 1/181 361/820 |
| 2013/0025925 | A1* | 1/2013 | Naganuma | H05K 3/4694 174/262 |
| 2013/0215577 | A1* | 8/2013 | Huang | H05K 3/361 361/737 |
| 2014/0118952 | A1* | 5/2014 | Seo | H05K 7/20963 361/720 |

FOREIGN PATENT DOCUMENTS

| CN | 104411089 | 3/2015 |
| CN | 108093563 | 5/2018 |
| JP | 408116145 | 5/1996 |
| JP | H11109397 | 4/1999 |

OTHER PUBLICATIONS

First Office Action dated Nov. 28, 2019 for Chinese Patent Application 201910156920.5.

* cited by examiner

*Primary Examiner* — Hoa C Nguyen
(74) *Attorney, Agent, or Firm* — Thomas | Horstemeyer, LLP

(57) ABSTRACT

A circuit board structure includes a circuit board body having an adsorption surface; an auxiliary board on which a binding mark is disposed. The auxiliary board is spliced to the circuit board body, and a surface of the auxiliary board is flush with the adsorption surface. A part of the adsorption surface and a part of the surface of the auxiliary board together form an adsorption zone.

4 Claims, 3 Drawing Sheets

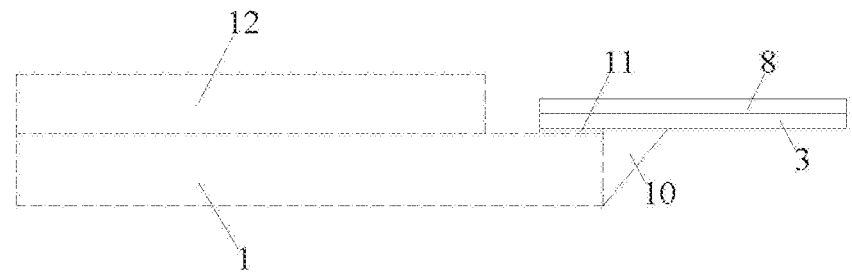

Fig.4

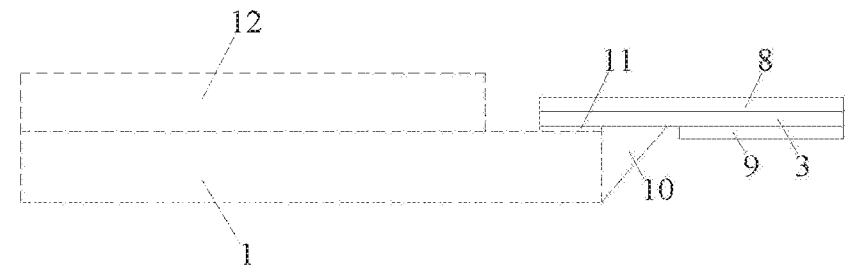

Fig.5

| providing a circuit board body and an auxiliary board on which a binding mark is disposed | S10 |

| splicing the auxiliary board to the circuit board body, and aligning a surface of the auxiliary board to be flush with an adsorption surface of the circuit board body, a part of the adsorption surface and a part of the surface of the auxiliary board together form an adsorption zone | S20 |

Fig.6

CIRCUIT BOARD STRUCTURE AND FABRICATING METHOD THEREOF, DISPLAY PANEL AND FABRICATING METHOD THEREOF

CROSS REFERENCE TO RELATED APPLICATION

This application is based upon and claims priority to Chinese Patent Application No. 201910156920.5, filed on Mar. 1, 2019, the entire contents thereof are incorporated herein by reference.

TECHNICAL FIELD

The present disclosure relates to the field of display technologies and, more particularly, to a circuit board structure, a fabricating method of a circuit board structure, a display panel, and a fabricating method of a display panel.

BACKGROUND

In the fabricating process of a display screen, the step of binding the flexible printed circuit board and the chip on film, or the step of binding the flexible printed circuit board to the back plate, is an important process step and the binding quality directly affects the display function and quality of the display screen.

The information disclosed in the background section above is only intended to enhance understanding of the background of the present disclosure and thus, may include information that does not constitute prior art known to those of ordinary skill in the art.

SUMMARY

According to an aspect of the present disclosure, a circuit board structure is provided, including:
 a circuit board body having an adsorption surface; and
 an auxiliary board on which a binding mark is disposed, wherein the auxiliary board is spliced to the circuit board body, and a surface of the auxiliary board is flush with the adsorption surface, a part of the adsorption surface and a part of the surface of the auxiliary board together forming an adsorption zone.

In an exemplary embodiment of the present disclosure, the circuit board structure further includes a first carrier film on the circuit board body and the auxiliary board to connect the circuit board body and the auxiliary board.

In an exemplary embodiment of the present disclosure, the first carrier film is provided at least at the adsorption zone.

In an exemplary embodiment of the present disclosure, an area of the first carrier film is equal to a sum of areas of the circuit board body and the auxiliary board.

In an exemplary embodiment of the present disclosure, the circuit board structure further includes a second carrier film on a side of the circuit board body and the auxiliary board opposite to the first carrier film to connect the circuit board body and the auxiliary board.

In an exemplary embodiment of the present disclosure, a region on which the binding mark is disposed on the auxiliary board is a binding zone, and the second carrier film is disposed at a region other than the binding zone.

In an exemplary embodiment of the present disclosure, the circuit board structure further includes two auxiliary boards symmetrically spliced to opposite sides of the circuit board body.

In an exemplary embodiment of the present disclosure, the auxiliary board is provided in a long strip shape, and a length of the auxiliary board is the same as a length of the circuit board body.

In an exemplary embodiment of the present disclosure, the auxiliary board has a thickness equal to or smaller than a thickness of the board body.

According to an aspect of the present disclosure, a fabricating method of a circuit board structure is provided, including:
 providing a circuit board body and an auxiliary board on which a binding mark is disposed; and
 splicing the auxiliary board to the circuit board body and aligning a surface of the auxiliary board to be flush with an adsorption surface of the circuit board body, a part of the adsorption surface and a part of the surface of the auxiliary board together forming an adsorption zone.

In an exemplary embodiment of the present disclosure, the fabricating method of the circuit board structure further includes: bonding a first carrier film to the circuit board body and the auxiliary board to connect the circuit board body and the auxiliary board.

In an exemplary embodiment of the present disclosure, the fabricating method of the circuit board structure further includes: bonding a second carrier film to a side of the circuit board body and the auxiliary board opposite to the first carrier film.

In an exemplary embodiment of the present disclosure, the circuit board body and the auxiliary board are integrally formed and then separated.

In an exemplary embodiment of the present disclosure, a thickness of the auxiliary board is equal to or smaller than a thickness of the circuit board body.

According to an aspect of the present disclosure, a fabricating method of a display panel is provided, including:
 providing a circuit board structure fabricated by a fabricating method of a circuit board structure as described above;
 binding the circuit board structure to a back plate; and
 removing an auxiliary board of the circuit board structure.

According to an aspect of the present disclosure, a display panel is provided, the display panel being fabricated by a fabricating method of a display panel according to present disclosure.

BRIEF DESCRIPTION OF THE DRAWINGS

The above and other features and advantages of the present disclosure will become more apparent from the detailed description of the exemplary embodiments with reference to the accompanying drawings.

FIG. 4 is a schematic structural view of another embodiment of the circuit board structure of the present disclosure;

FIG. 5 is a schematic structural view of a further embodiment of the circuit board structure according to the present disclosure;

FIG. 6 is a schematic block flow diagram of a fabricating method of a circuit board structure according to the present disclosure;

DETAILED DESCRIPTION

Figure 1:
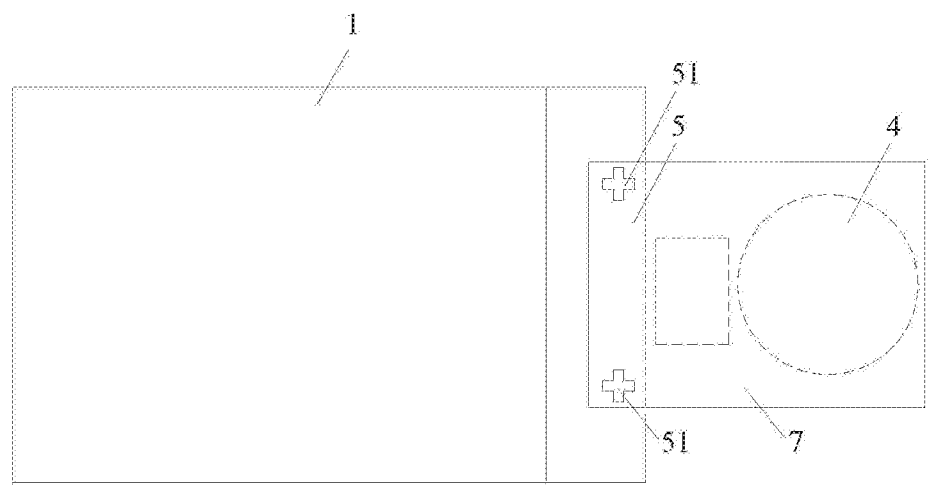
FIG. 1 is a schematic view of a circuit board structure of prior art.

Example embodiments will now be described more fully with reference to the accompanying drawings. However, the example embodiments can be embodied in a variety of forms and should not be construed as being limited to the embodiments set forth herein. Rather, these embodiments are provided so that this disclosure will be thorough and complete, and the concepts of the example embodiments will be fully given to those skilled in the art. The same reference numerals in the drawings denote the same or similar structures, and thus, their detailed descriptions will be omitted.

Referring to the schematic structural view of the circuit board structure in the related art shown in FIG. 1, in order to enable the binding machine to accurately and stably perform a binding process, binding marks 51 for aligning the binding machine are required to be disposed at both ends of the binding zone of the back plate 1 and at corresponding positions of the binding zone 5 of the flexible printed circuit board or the chip on film 7. In order to make the machine platform accurately and stably carry the flexible printed circuit board or the chip on film 7 to the binding position, the flexible printed circuit board or the chip on film 7 needs a space (the adsorption zone 4) with a certain area for a suction nozzle of the machine platform or other carrying mechanisms to use. Thus, the overall size of the flexible printed circuit board or the chip on film 7 is large, and the size of the display panel is also large, which does not meet the current popular narrow frame requirement.

Therefore, it is necessary to research a new circuit board structure and a fabricating method thereof, a display panel and a fabricating method thereof.

Figure 2:
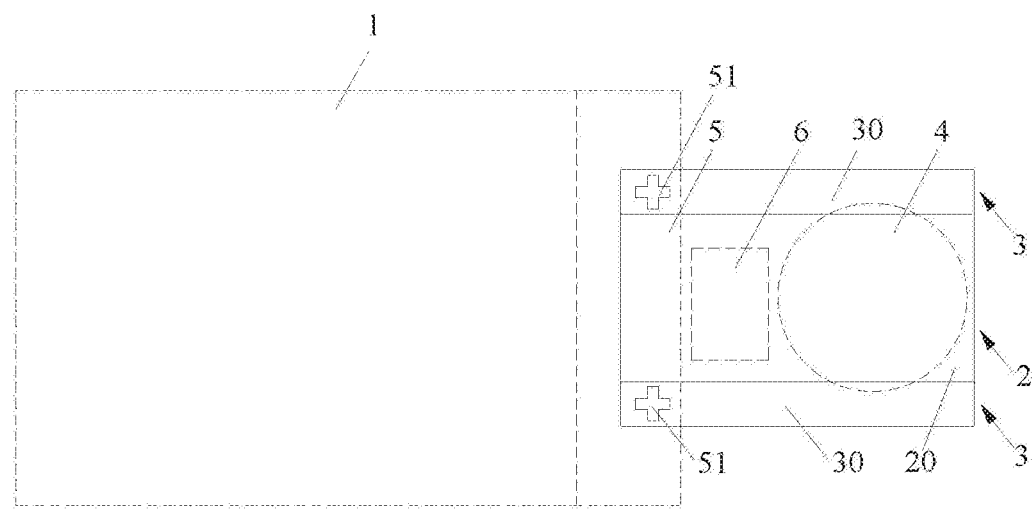
FIG. 2 is a schematic structural view of an embodiment of a circuit board structure according to the present disclosure.

FIG. 2 shows a schematic structural view of an embodiment of the circuit board structure of the present disclosure, in which the circuit board structure may include a circuit board body 2 and an auxiliary board 3. The auxiliary board 3 is provided with a binding mark 51 thereon, the auxiliary board 3 is spliced to the circuit board body 2, an upper surface 30 of the auxiliary board 3 is flush with an adsorption surface adsorption surface 20, and a part of the adsorption surface adsorption surface 20 and a part of the upper surface 30 of the auxiliary board 3 together form an adsorption zone 4, so that an area of the adsorption zone 4 is increased.

In the present exemplary embodiment, a surface of the auxiliary board 3 and the circuit board body 2 to be sucked by the suction nozzle of the machine platform may be referred to as a adsorption surface adsorption surface 20, a surface of the circuit board body 2 to be bound to the machine platform may be referred to as a binding surface, and the adsorption surface and the binding surface are disposed opposite to each other.

In the present exemplary embodiment, the circuit board body 2 is provided in a rectangular plate shape. One end of the binding surface of the circuit board body 2 in the length direction is provided with a binding zone 5, and the binding zone 5 is provided for binding the circuit board body 2 with the back plate 1. The other end of the adsorption surface of the circuit board body 2 in the length direction is provided with an adsorption zone 4 for the machine platform to adsorb. An intermediate region between the binding zone 5 and the adsorption zone 4 is provided as an element zone 6, and the element zone 6 is provided with an electronic element.

In the present exemplary embodiment, two auxiliary boards 3 are provided. The two auxiliary boards 3 are both provided in a long plate shape. The length of the two auxiliary boards 3 is the same as that of the circuit board body 2, and the two auxiliary boards 3 are symmetrically spliced to opposite sides of the circuit board body 2. One end of the auxiliary board 3 in the length direction is provided with a binding zone 5, and the binding zone 5 is provided with a binding mark 51 for use when binding with the back plate 1. Binding zones 5 of the two auxiliary boards 3 and the circuit board body 2 form a larger binding zone 5. The binding mark 51 is provided on the auxiliary board 3, and the binding mark 51 is not required to be provided on the circuit board body 2, so that the region of the circuit board body 2 where the binding mark 51 is provided can be saved and thus, the overall size of the circuit board body 2 can be reduced. The remaining position of the auxiliary board 3 is a blank zone. The blank zone of the two auxiliary boards 3 and the adsorption zone 4 of the circuit board body 2 form a larger adsorption zone 4, so that the adsorption zone 4 is large enough to meet the adsorption requirement of a machine platform. The area of the adsorption zone 4 of the circuit board structure is increased by the auxiliary board 3, so that the area of the adsorption zone 4 of the circuit board body 2 can be provided to be smaller, and the overall size of the circuit board body 2 can be reduced.

In the present exemplary embodiment, the thickness of the auxiliary board 3 may be the same as the thickness of the circuit board body 2, so that the auxiliary board 3 and the circuit board body 2 form a flat adsorption surface, which facilitates the suction nozzle of the machine platform to adsorb. Of course, the thickness of the auxiliary board 3 may be different from the thickness of the circuit board body 2, that is, the thickness of the auxiliary board 3 may be smaller than the thickness of the circuit board body 2 and the auxiliary board 3 may also be provided in a stepped shape (the thickness of the binding zone 5 of the auxiliary board 3 may be the same as the thickness of the circuit board body 2, and the thickness of the blank zone of the auxiliary board 3 may be smaller than the thickness of the circuit board body 2), so long as the adsorption surface forms a flat adsorption surface to facilitate the suction nozzle of the machine platform to conveniently adsorb.

Figure 3:
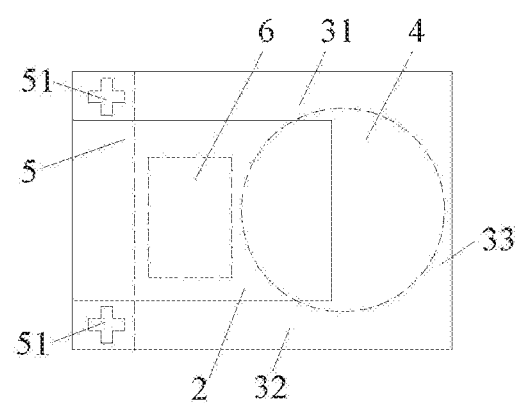
FIG. 3 is a schematic structural view of another embodiment of the circuit board structure of the present disclosure.

Of course, the structure of the auxiliary board 3 is not limited to the above description. For example, referring to the schematic structural view of another embodiment of the circuit board structure of the present disclosure shown in FIG. 3, the auxiliary board 3 may include a first connecting plate 31, a second connecting plate 32, and a third connecting plate 33. The first connecting plate 31 and the second connecting plate 32 are symmetrically disposed, and the third connecting plate 33 is connected to one end of the first connecting plate 31 and one end of the second connecting plate 32, so that the first connecting plate 31, the second connecting plate 32, and the third connecting plate 33 form a "U" shape. The first connecting plate 31 and the second connecting plate 32 are each provided with a binding mark 51 at one end thereof to which the third connecting plate 33 is not connected. The first connecting plate 31, the second connecting plate 32, and the third connecting plate 33 are spliced to the other three sides of the circuit board body 2 where the binding zone 5 is not provided. In this case, the circuit board body 2 may be provided to be narrower, and the width of the circuit board body 2 is supplemented by the first connecting plate 31 and the second connecting plate 32. The circuit board body 2 may be provided to be shorter, and the length of the circuit board body 2 is supplemented by the third connecting plate 33.

Referring to the schematic structural view of another embodiment of the circuit board structure of the present disclosure shown in FIG. 4, in the present exemplary embodiment, a package glass plate 12 is disposed on the back plate 1, an anisotropic conductive adhesive film 11 is disposed between a surface of the back plate 1 adjacent to the circuit board body 2 and a surface of the circuit board body 2 adjacent to the back plate 1, and a sidewall of the back plate 1 is adhered to the circuit board body 2 by an adhesive 10. The two auxiliary boards 3 and the circuit board body 2 may be connected by a first carrier film 8. The first carrier film 8 is bonded to a surface of the circuit board body 2 and the two auxiliary boards 3 opposite to the binding surface, that is, the first carrier film 8 is bonded to the surface (adsorption surface) of the circuit board body 2 and the two auxiliary boards 3 to which the machine platform is adsorbed. The area of the first carrier film 8 is equal to the sum of areas of the circuit board body 2 and the two auxiliary boards 3, and the first carrier film 8 bonds the surfaces of the circuit board body 2 and the two auxiliary boards 3 to which the machine platform is absorbed, to form a flat plane. Of course, the area of the first carrier film 8 may be smaller than the sum of the areas of the circuit board body 2 and the two auxiliary boards 3, and the first carrier film 8 may be bonded only to the adsorption zone 4. The area of the first carrier film 8 may also be larger than the sum of the areas of the circuit board body 2 and the two auxiliary boards 3. The first carrier film 8 is a film material having a slight tackiness.

Referring to the schematic structural view of a further embodiment of the circuit board structure of the present disclosure shown in FIG. 5, a second carrier film 9 may be further bonded to the binding surface of the two auxiliary boards 3 and the circuit board body 2. The second carrier film 9 is disposed on the surface of the circuit board body 2, and the auxiliary boards opposite to the first carrier film, for example, may be bonded to the non-binding zone of the binding surface of the two auxiliary boards 3 and the circuit board body 2. The area of the second carrier film 9 is smaller than the sum of areas of the circuit board body 2 and the two auxiliary boards 3. The second carrier film 9 is a film material having a slight tackiness.

In addition, the connection manner of the two auxiliary boards 3 and the circuit board body 2 is not limited to the above description, for example, the two auxiliary boards 3 and the circuit board body 2 may be bonded by an adhesive, i.e., an adhesive is applied to the joint surface of the two auxiliary boards 3 spliced to the circuit board body 2, and then, the two auxiliary boards 3 and the circuit board body 2 are bonded together. The glue has a slight tackiness.

According to the circuit board structure, the auxiliary board is spliced to the circuit board body to increase the area of the adsorption zone of the circuit board structure, and the binding mark is provided on the auxiliary board. The auxiliary board may be removed after the binding of the circuit board structure is completed. On one hand, the binding mark is provided on the auxiliary board, and the binding mark is not required to be provided on the circuit board body, thereby saving the region of the circuit board body to which the binding mark is provided, and reducing the overall size of the circuit board body. On the other hand, the area of the adsorption zone of the circuit board structure is increased through the auxiliary board, the area of the adsorption zone of the circuit board body may be smaller, and the overall size of the circuit board body may be reduced.

The present disclosure also provides a fabricating method of the circuit board structure. Referring to the schematic flow block diagram of the fabricating method of the circuit board structure shown in FIG. 6, the fabricating method may include the following steps:

step S10: providing a circuit board body 2 and an auxiliary board 3; and step S20: splicing the auxiliary board 3 to the circuit board body 2, and making an upper surface of the auxiliary board 3 flush with the adsorption surface adsorption surface 20 of the circuit board body 2, wherein a part of the circuit board body 2 and a part of the upper surface 30 of the auxiliary board 3 together form an adsorption zone 4 thereby increasing the area of the adsorption zone 4 of the circuit board structure, and the auxiliary board 3 is provided with a binding mark 51.

The following describes a fabricating method of a circuit board structure in detail.

In the present exemplary embodiment, the circuit board body 2 and the auxiliary board 3 may be cut after being integrally formed. That is, an element zone 6 is formed on a circuit board by processing, and then the circuit board is cut by a cutting die, a laser, or the like to form the circuit board body 2 and the auxiliary board 3, and the element zone 6 remains on the circuit board body 2. The circuit board body 2 and the auxiliary board 3 cut after integrally formed have higher precision. Of course, the circuit board body 2 and the auxiliary board 3 may be separately formed and then spliced to form a circuit board structure.

In the present exemplary embodiment, after the two auxiliary boards 3 are spliced to the circuit board body 2, the first carrier film 8 is bonded to the surface the circuit board body 2 opposite to the binding surface with two auxiliary boards 3, i.e., the first carrier film 8 is bonded to the surface (adsorption surface) of the circuit board body 2 and the two auxiliary boards 3 to which the machine platform is adsorbed.

In the present exemplary embodiment, after the first carrier film 8 is bonded, the second carrier film 9 is bonded to the binding surface of the circuit board body 2 and the two auxiliary boards 3.

Of course, the two auxiliary boards 3 may be coated with an adhesive on the splicing surface thereof spliced to the circuit board body 2 and then, bonded to the splicing surface of the circuit board body 2.

The specific structures of the circuit board body 2, the auxiliary board 3, the first carrier film 8, and the second carrier film 9 have been described in detail in the circuit board structure and therefore, are not repeated herein.

Figure 7:
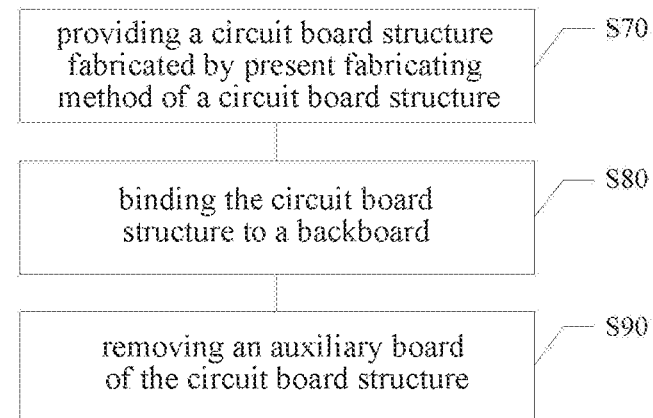
FIG. 7 is a schematic block flow diagram of a fabricating method of a display panel of the present disclosure.

Further, the present disclosure also provides a fabricating method of a display panel, referring to the schematic flow diagram of the fabricating method of a display panel shown in FIG. 7, the fabricating method of a display panel may include the following steps:

step S70: providing a circuit board structure, wherein the circuit board structure is fabricated according to the fabricating method of the circuit board structure;

step S80: binding the circuit board structure to the back plate 1;

step S90: removing the auxiliary board 3.

The fabricating method of the circuit board structure has been described in detail above, and therefore, the details are not described herein.

In the step S80: binding the circuit board structure to the back plate 1.

In the present exemplary embodiment, the binding machine identifies the binding mark 51 on the auxiliary board 3 and the binding mark on the back plate 1 and binds the circuit board body 2 to the back plate 1 after aligning the binding mark 51 on the auxiliary board 3 with the binding mark on the back plate 1.

In step S90, the auxiliary board 3 is removed.

In the present exemplary embodiment, the auxiliary board 3 is removed after tearing off the first carrier film 8 and the second carrier film 9. Of course, in the case where the auxiliary board 3 and the circuit board body 2 are bonded by an adhesive, the auxiliary board 3 may be directly removed.

Figure 8:
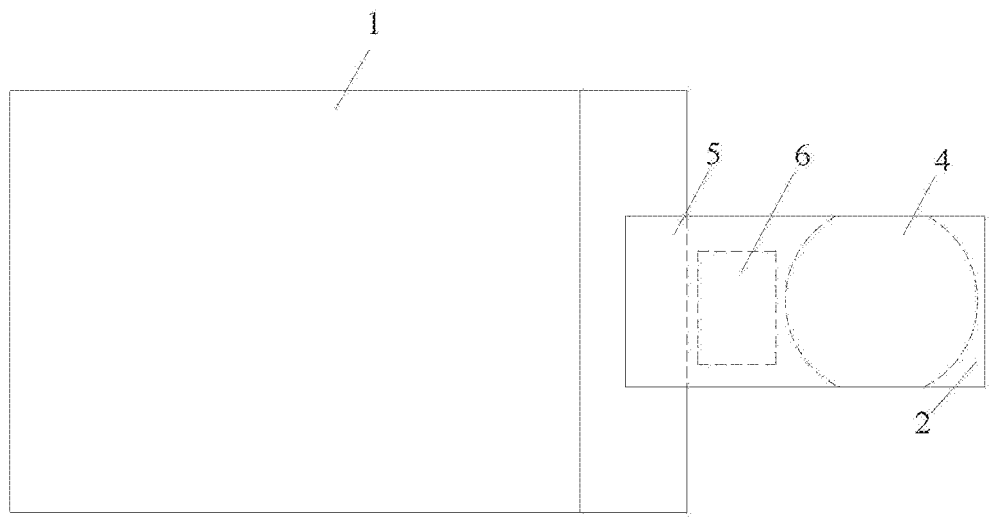
FIG. 8 is a schematic structural view of a display panel according to the present disclosure.

Furthermore, the present disclosure also provides a display panel, which is fabricated according to the fabricating method of the display panel, and the structure schematic view of the display panel is shown in FIG. 8. According to the display panel fabricated by the method, the narrow frame design can be better realized due to the smaller overall size of the circuit board body 2.

The features, structures, or characteristics described above may be combined in one or more embodiments in any suitable manner, and the features discussed in the various embodiments are interchangeable, if possible. In the following description, numerous specific details are provided in order to fully understand the embodiments of the present disclosure. However, the person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on", "below", "upper", and "lower" are used in the specification to describe the relative relationship of one component to another component, these terms are used in this specification for convenience only, for example, a direction in the example according to the accompanying drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In this specification, the terms such as "a", "an", "the" and "said" are used to indicate the presence of one or more elements/components. The terms "comprise", "include", "have", "contain" and their variants are used to be open-type and are meant to include additional elements/components, etc., in addition to the listed elements/components/etc.; the terms "first", "second", etc. are used only as marks, rather than limitation for the number of objects.

It should be understood that the present disclosure is not limited in its application to the details of construction and the arrangement of components set forth in the following description. The present disclosure is capable of other embodiments and of being practiced and carried out in various ways. The foregoing variations and modifications are within the scope of the present disclosure. It will be understood that the present disclosure disclosed and defined in this specification extends to all alternative combinations of two or more of the individual features mentioned or evident from the text and/or drawings. All of these different combinations constitute various alternative aspects of the present disclosure. The embodiments described in this specification illustrate the best mode known for practicing the present disclosure and will enable those skilled in the art to utilize the present disclosure.

What is claimed is:

1. A circuit board structure, comprising:
   a circuit board body having an adsorption surface;
   an auxiliary board on which a binding mark is disposed, wherein the auxiliary board is spliced to the circuit board body to increase an area of an adsorption zone of the circuit board structure, an adsorption surface of the auxiliary board is flush with the adsorption surface of the circuit board body, a part of the adsorption surface of the circuit board body and a part of the adsorption surface of the auxiliary board together form the adsorption zone, and the auxiliary board has a thickness equal to or smaller than a thickness of the circuit board body;
   a first carrier film on the circuit board body and the auxiliary board to connect the circuit board body and the auxiliary board, wherein the first carrier film is provided at least at the adsorption zone, and an area of the first carrier film is equal to a sum of areas of the circuit board body and the auxiliary board; and
   a second carrier film on a side of the circuit board body and the auxiliary board opposite to the first carrier film to connect the circuit board body and the auxiliary board.

2. The circuit board structure according to claim 1, wherein a region on which the binding mark is disposed on the auxiliary board is a binding zone, and the second carrier film is disposed at a region other than the binding zone.

3. The circuit board structure according to claim 1, further comprising two auxiliary boards symmetrically spliced to opposite sides of the circuit board body.

4. The circuit board structure according to claim 3, wherein the auxiliary board is provided in a long strip shape, and a length of the auxiliary board is the same as a length of the circuit board body.

* * * * *